US011444012B2

(12) United States Patent
Chien et al.

(10) Patent No.: US 11,444,012 B2
(45) Date of Patent: Sep. 13, 2022

(54) PACKAGED ELECTRONIC DEVICE WITH SPLIT DIE PAD IN ROBUST PACKAGE SUBSTRATE

(71) Applicant: Texas Instruments Incorporated, Dallas, TX (US)

(72) Inventors: Yuh-Harng Chien, New Taipei (TW); Chang-Yen Ko, Taipei (TW); Chih-Chien Ho, New Taipei (TW)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/831,503

(22) Filed: Mar. 26, 2020

(65) Prior Publication Data
US 2021/0305139 A1  Sep. 30, 2021

(51) Int. Cl.
*H01L 25/16* (2006.01)
*H01L 23/498* (2006.01)
*H01L 23/31* (2006.01)
*H01L 21/48* (2006.01)
*H01L 21/56* (2006.01)
(Continued)

(52) U.S. Cl.
CPC .... *H01L 23/49811* (2013.01); *H01L 21/4825* (2013.01); *H01L 21/561* (2013.01); *H01L 21/565* (2013.01); *H01L 23/3114* (2013.01); *H01L 23/3121* (2013.01); *H01L 23/49861* (2013.01); *H01L 24/45* (2013.01); *H01L 24/85* (2013.01); *H01L 24/96* (2013.01); *H01L 24/97* (2013.01); *H01L 25/16* (2013.01); *H01L 25/50* (2013.01)

(58) Field of Classification Search
CPC .......... H01L 23/49811; H01L 23/3114; H01L 23/3121; H01L 23/49861; H01L 25/16; H01L 25/50; H01L 24/45; H01L 24/85; H01L 24/96; H01L 24/97; H01L 21/48; H01L 21/25; H01L 21/561; H01L 21/565
See application file for complete search history.

(56) References Cited

U.S. PATENT DOCUMENTS 6,703,696 B2 * 3/2004 Ikenaga ................. H01L 24/49
                                                    257/678
7,008,825 B1 * 3/2006 Bancod .............. G01R 31/2896
                                                    257/666
(Continued)

FOREIGN PATENT DOCUMENTS

EP          0489349         10/1992

*Primary Examiner* — Timor Karimy
(74) *Attorney, Agent, or Firm* — Dawn Jos; Charles A. Brill; Frank D. Cimino

(57) ABSTRACT

In a described example, an apparatus includes a package substrate with a split die pad having a slot between a die mount portion and a wire bonding portion; a first end of the wire bonding portion coupled to the die mount portion at one end of the slot; a second end of the wire bonding portion coupled to a first lead on the package substrate. At least one semiconductor die is mounted on the die mount portion; a first end of a first wire bond is bonded to a first bond pad on the at least one semiconductor die; a second end of the first wire bond is bonded to the wire bonding portion; and mold compound covers the at least one semiconductor die, the die mount portion, the wire bonding portion, and fills the slot.

19 Claims, 13 Drawing Sheets

(51) Int. Cl.
*H01L 23/00* (2006.01)
*H01L 25/00* (2006.01)

(56) References Cited

U.S. PATENT DOCUMENTS

| | | | |
|---|---|---|---|
| 2002/0084518 A1* | 7/2002 | Hasebe | H01L 21/4853 257/676 |
| 2004/0201111 A1 | 10/2004 | Thurgood | |
| 2005/0189642 A1 | 9/2005 | Bolken et al. | |
| 2019/0115331 A1* | 4/2019 | Murtuza | H01L 25/50 |

* cited by examiner

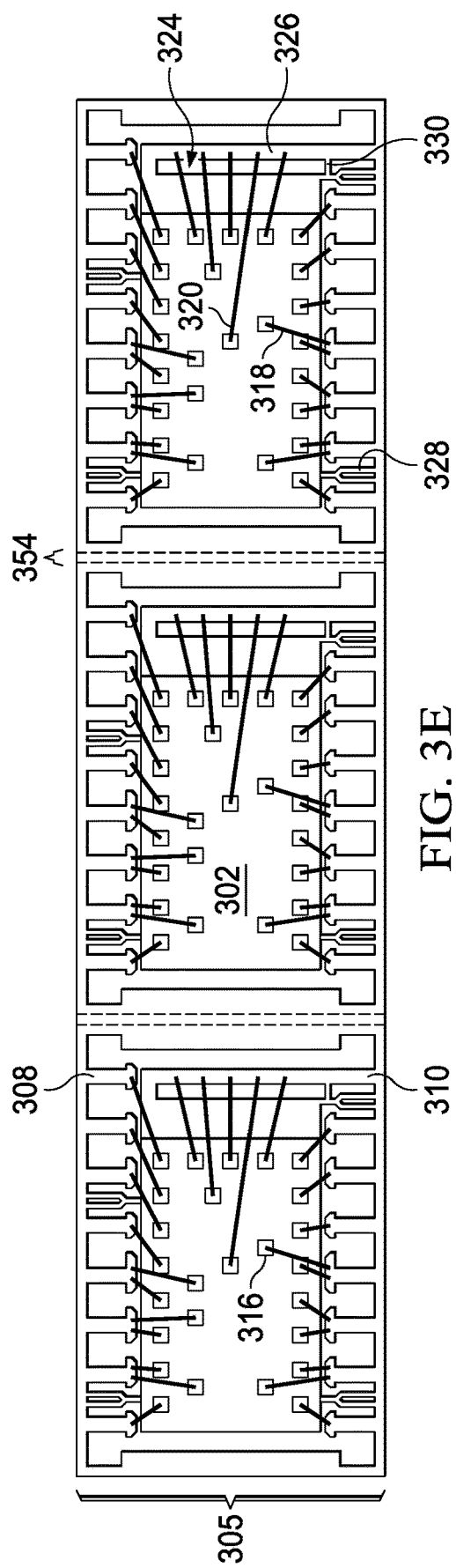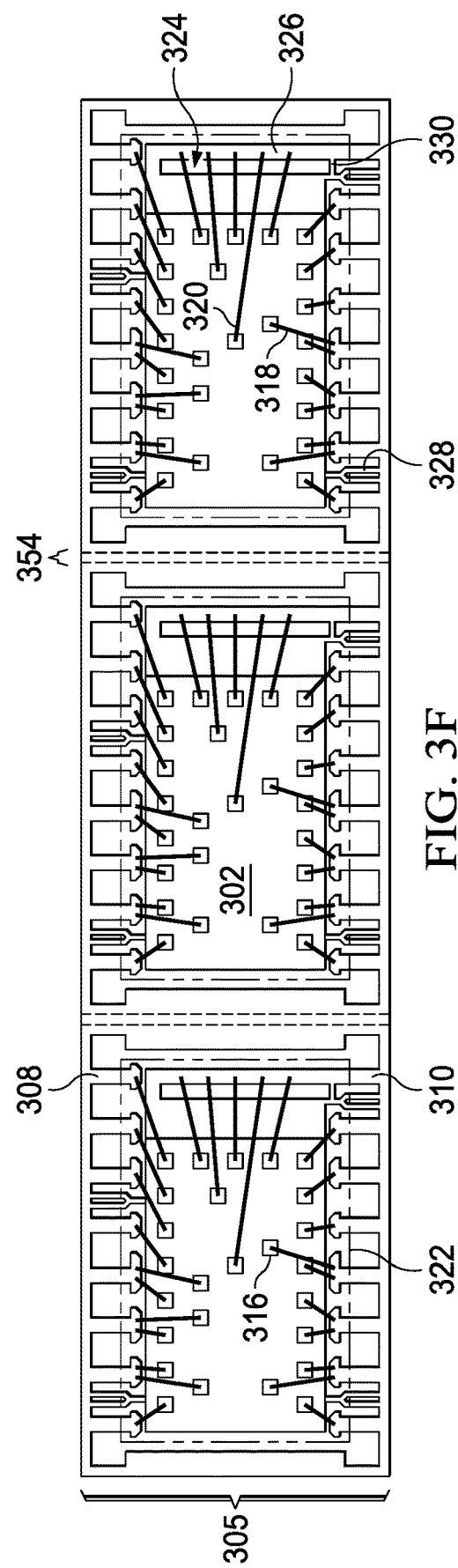

SMALL OUTLINE IC

DUAL INLINE PACKAGE IC

QUAD FLAT PACKAGE IC

QUAD FLAT NO LEAD IC

PACKAGED ELECTRONIC DEVICE WITH SPLIT DIE PAD IN ROBUST PACKAGE SUBSTRATE

TECHNICAL FIELD

This disclosure relates generally to packaged electronic devices, and more particularly to packaged semiconductor die with wire bonds coupled to a die pad.

SUMMARY

In a described example, an apparatus includes a package substrate with a split die pad having a slot between a die mount portion and a wire bonding portion; a first end of the wire bonding portion connected to the die mount portion at one end of the slot; and a second end of the wire bonding portion connected to a first lead on the package substrate. At least one semiconductor die is mounted on the die mount portion; a first end of a first wire bond is bonded to a first bond pad on the at least one semiconductor die; a second end of the first wire bond is bonded to the wire bonding portion; and mold compound covers the at least one semiconductor die, the die mount portion, the wire bonding portion, and fills the slot.

BRIEF DESCRIPTION OF THE DRAWINGS

FIGS. 3A-3G are a series of views illustrating the major steps in the manufacture of a packaged semiconductor die with a lead frame with a split die pad of the arrangements.

DETAILED DESCRIPTION

Figure 1A:
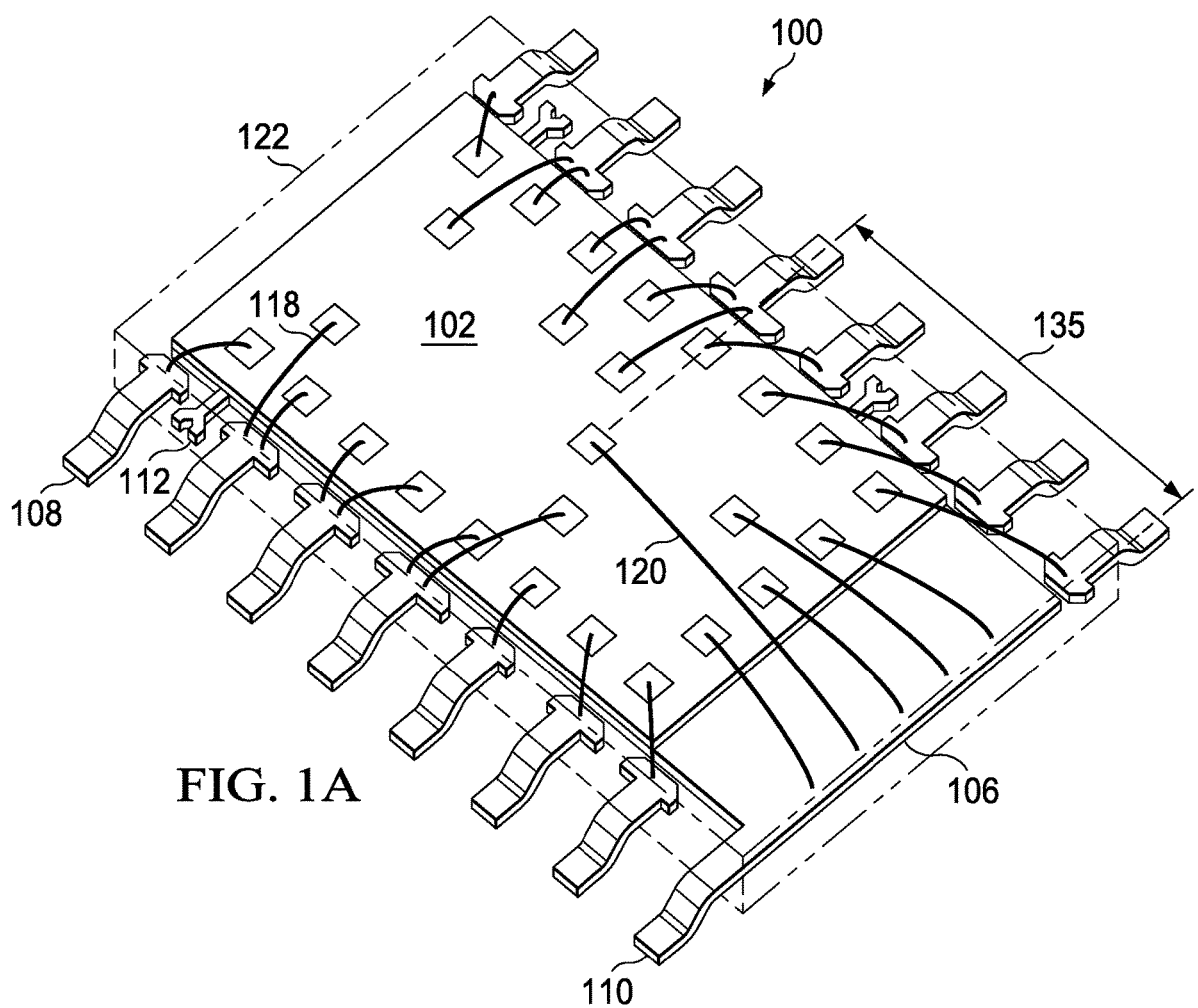
FIGS. 1A-1D are a projection view of a packaged semiconductor die, a cross section of the packaged semiconductor die, and plan views of a lead frame with a semiconductor die mounted on a die pad and with wire bonds to the die pad.

Corresponding numerals and symbols in the different figures generally refer to corresponding parts, unless otherwise indicated. The figures are not necessarily drawn to scale.

Elements are described herein as "coupled." As used herein, the term "coupled" includes elements that are directly connected, and elements that are electrically connected even with intervening elements or wires are also coupled.

The term "semiconductor die" is used herein. A semiconductor die can be a discrete semiconductor device such as a bipolar transistor, a few discrete devices formed together on a semiconductor substrate such as a pair of power FET switches fabricated together on a single semiconductor die, or a semiconductor die can include multiple semiconductor devices such as the multiple capacitors in an A/D converter. The semiconductor die can include passive devices such as resistors, inductors, filters, or active devices such as transistors. The semiconductor die can be an integrated circuit with hundreds or thousands of transistors coupled to form a functional digital circuit, for example a computer processor or memory device. The semiconductor die can be a passive device such as a sensor. Example sensors include photocells, transducers, and charge coupled devices (CCDs), or can be a micro-electromechanical device, such as a digital micromirror device (DMD) or another MEMS device.

The term "scribe lane" is used herein. A scribe lane is a portion of semiconductor wafer between semiconductor dies. Sometimes in related literature the term "scribe street" is used. Once processing is finished and the semiconductor devices are complete, the semiconductor devices are separated into individual semiconductor dies by severing the semiconductor wafer along the scribe lanes. The separated dies can then be removed and handled individually for further processing including packaging. This process of removing dies from a wafer is referred to as "singulation" or sometimes is referred to as "dicing." Scribe lanes are arranged on four sides of semiconductor dies and when the dies are singulated from one another, rectangular semiconductor dies are formed.

The term "quad flat no-lead" or "QFN" is used herein for a device package. A QFN package has leads that are coextensive with the sides of a molded package body, and in a quad package the leads are on four sides. Alternative no-lead packages have leads on two sides (small outline no-lead or "SON" package). Alternative flat no-lead packages may have leads on one side. No lead packages can be surface mounted to a board. Leaded packages can be used with the arrangements where leads extend away from the molded package body and are shaped to form a terminal portion for soldering to a board. A leaded package can have leads on four sides and be referred to as a quad flat package. A dual in line package, or "DIP," can be used with the arrangements. A small outline IC package, or "SOIC", can be used with the arrangements.

The term "package substrate" is used herein. A package substrate is a substrate arranged to receive a semiconductor die and to support the semiconductor die in a completed semiconductor package. Package substrates include conductive lead frames, which can be formed from copper, aluminum, stainless steel and alloys such as Alloy 42. Stamping and etching processes can be used to produce the lead frames. The lead frames can include a die pad for mounting the semiconductor die, and conductive leads arranged proximate to the die pad for coupling to bond pads on the semiconductor die using wire bonds, wire ribbon bonds, or other conductors. The lead frames can be provided in strips or in two dimensional arrays. Dies can be placed on the lead frame strips or arrays, the dies placed on a die pad for each device, and die attach or die adhesive can be used to mount the dies to the lead frame die pads. Wire bonds or ribbon bonds can couple bond pads on the semiconductor dies to the die pads and to leads of the lead frames. After the wire bonds are in place, a portion of the substrate, the bond wires, the die, and at least a portion of the die pad can be covered with a protective material such as a mold compound. Thermoset mold compound such as resin epoxy can be used. Transfer molding can be used, or block molding can be used, to form the package bodies from mold compound. After the molding, the individual packaged devices can be cut from the strips and mold compound, for leaded package types, exposed portions of the lead frame leads then form terminals for the packaged semiconductor device. For no-lead package types, the mold compound does not cover the ends of the leads, which form terminals exposed from the molded package body. The leads or terminals can be used for mounting the packaged semiconductor device to a board.

Alternative package substrates include pre-molded lead frames (PMLF) and molded interconnect substrates (MIS) for receiving semiconductor dies. These substrates can include mold compound and conductive portions in the mold compound. The lead frames can include stamped and partially etched lead frames. In a partially etched lead frame, two levels of metal can be formed by etching a pattern from one side of the metal lead frame, and then etching from the other side, to form full thickness and partial thickness portions, and in some areas, all of the metal can be etched to form openings through the partially etched lead frames. The package substrate can also be tape-based and film-based substrates carrying conductors; ceramic substrates, laminate substrates with multiple layers of conductors and insulator layers; and printed circuit board substrates of ceramic, fiberglass or resin, or glass reinforced epoxy substrates such as FR4. In example arrangements, a downset lead frame can have portions at a lower level than other portions. For example, the die pad can be downset from the leads.

The term "mold lock" is used herein to describe openings in a package substrate, for example a lead frame, for the purpose of allowing mold compound bridges to form between mold compound formed on the frontside of the lead frame and on the backside of the lead frame. This locks the frontside and backside mold compound together, significantly reducing delamination between the mold compound and the lead frame.

The term "die pad" is used herein. As used herein, a die pad is a portion of a package substrate that is configured to mount a semiconductor device die. In some references, the portion is shaped like a paddle, and the term "die paddle" is used. As used herein a die paddle is a die pad.

In wire bonded packages used with semiconductor device dies, a die pad or is formed of lead frame material, surrounded by various conductive leads that are also of the lead frame material. An exterior frame mechanically supports the leads and the die pad during die mount, wire bonding, and molding operations. The lead frame can be stamped or etched to form a pattern. Copper, stainless steel, and alloy 42 are often used. Lead frames are also often plated with nickel, palladium, gold, silver and other platings to increase solderability and bondability, and to reduce corrosion. After the semiconductor die or dies are mounted to the die pad using die attach materials, bond wires are affixed to conductively couple bond pads of the semiconductor die to leads of the lead frame. Some wire bonds coupled the bond pads of the semiconductor die to the di pad of the lead frame. Typically thermosonic wire bond tools use a combination of heat, mechanical compression, and ultrasonic energy to bond a very fine bond wire to a bond pad on the semiconductor die, this bond is often referred to as a "ball" bond. The fine bond wire is dispensed and shaped as a capillary in the tool carrying the wire moves away from the bond pad, and a "stitch" bond is formed at a lead of the lead frame, the bond wire is then cut as the capillary moves away from the stitch. Heat is used to form a molten ball at the end wire extending from the capillary to start the next bonding operation. Bond wires can be platinum, gold, copper, aluminum, and combinations of these. Gold, aluminum and copper bond wires are used in many current devices.

A problem with forming stitch bonds to a die pad where a die has been mounted is "resin bleed out." When a die is to be attached to the die pad, a die attach epoxy is dispensed in the die mount area, and a die is placed on the epoxy and pressed onto the die pad. The die attach epoxy can flow beneath the semiconductor die due to a capillary action. Resin from the die attach epoxy can "bleed out" and flow outside the area of the die pad covered by the semiconductor die, and onto the surface of the die pad. If the resin travels too far from the edge of the semiconductor die, it can interfere with subsequent stitch bonds that are made on the die pad, and cause a "non stick on lead" failure when a conductive wire bond is not successfully formed by a bond wire during bonding. The resin bleed out can also lead to delamination in the packaged device as mold compound adhesion to the epoxy or resin is less than to the lead frame surface.

In the arrangements, the problems of failed wire bonds and delamination in packaging semiconductor device dies in a molded package are solved by use of a split die pad having a die mount portion, a slot through the die pad, and second wire bonding portion spaced from the die mount portion by the slot. Use of the arrangements separates the wire bonding area from the die mounting area of the die pad, preventing resin bleed out in the die mounting portion from affecting the wire bonding; the slot forms an additional mold lock to increase adhesion of the mold compound to the die pad and to the semiconductor device die. Use of the split die pad of the arrangements also adds additional support features to reduce non-stick on pad and non-stick on lead wire bond problems due to the vibration of the die pad during thermosonic wire bonding operations. Use of the arrangements is particularly beneficial for multichip module packages where multiple semiconductor device dies are mounted on a single die pad, situations where resin bleed out is more likely to occur.

Figure 1B:
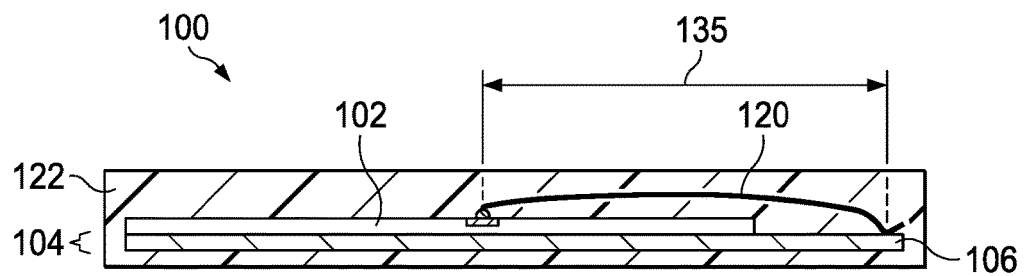
Figure 1C:
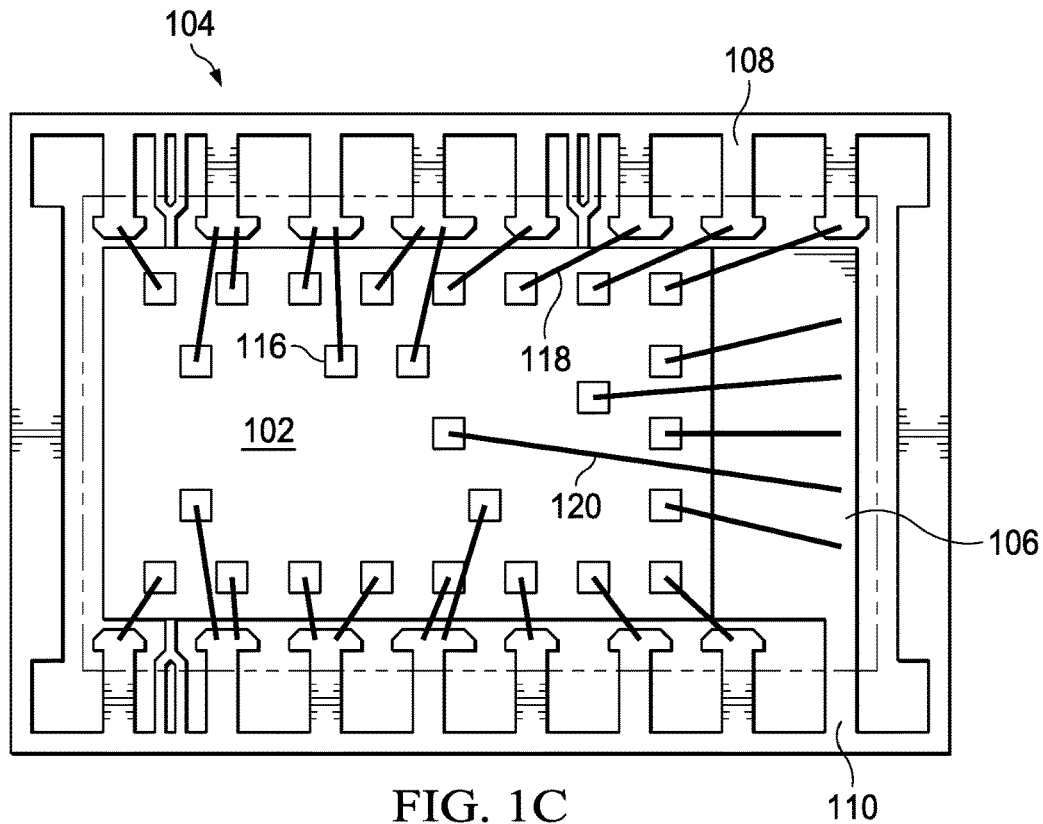
Figure 1D:
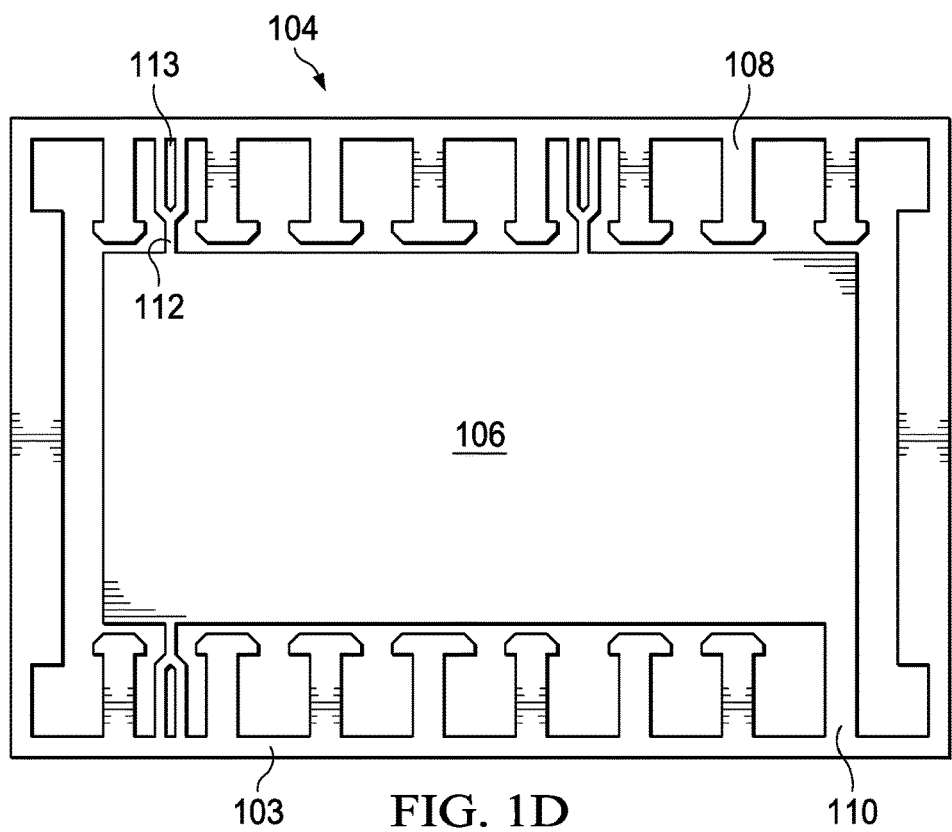

FIG. 1A shows in a projection view a small outline integrated circuit (SOIC) package 100 including a semiconductor die 102. FIGS. 1B and 1C show a cross sectional view and a top down view, respectively, of the semiconductor die 102 mounted on the die pad 106 of a lead frame 104, with bond pads of die 102 electrically coupled to the lead frame 104 with wire bonds 118 and 120. Note that wire bonds 120 couple the die pad 106 to the semiconductor die 102. FIG. 1D shows a top down view of the lead frame 104. The lead frame 104 has a die pad 106 on which the semiconductor die 102 is mounted. The die pad 106 is coupled to a fixed potential lead 110 on the lead frame 104. Wire bonds 120 between bond pads 116 on the semiconductor die 102 and the die pad 106 can provide a fixed electrical potential (usually ground) to the semiconductor die 102. The lead frame 104 also has lead frame leads 108 (signal leads) coupled to bond pads 116 on the semiconductor die 102 with wire bonds 118. An external frame 103 provides mechanical stability to the lead frame 104 including leads 108, 110, and die pad 106 during packaging. The external frame 103 is removed after mold compound is applied, during device singulation.

The lead frame 104 has damping tabs 112 between the die pad 106 and the external frame 103. In this example, the damping tabs 112 are not used for electrical connection, but instead strengthen the lead frame 104 and reduce vibration caused by ultrasonic welding during wire bonding. The ultrasonic vibration of the die pad can result in weak wire bonds 120. The damping tabs 112 will later be severed from the external frame 103 during a trim and form step following a molding operation. End portions of the fixed potential lead 110 and the signal leads 108 are not covered by mold compound 122 to enable the semiconductor die package 100 to be mounted on leads of a circuit substrate such as a printed circuit board. Mold lock openings 113 can be formed in the damping tabs 112 and elsewhere on the lead frame 104 to reduce delamination between the lead frame 104 and the mold compound 122. In the mold lock openings, mold compound flows through the mold lock during molding and when the mold compound cures, it hardens and secures the lead frame 104 with better adhesion, preventing or reducing delamination problems.

As shown in FIGS. 1A and 1B, wire bonds 120 are formed between bond pads 116 on the surface of the semiconductor die 102 and a portion of die pad 106. The die pad 106 can be at a fixed potential such as a ground or Vss supply potential. As shown in FIG. 1B, a ball bond is formed on a bond pad on die 102, the wire 120 then extends to a stitch bond formed on the die pad. The stitch bond is a "down" bond, because the die pad surface is lower (as oriented in FIG. 1B) than the bond pads on semiconductor die 102, so the during bonding the bond tool capillary has to extend the bond wire 120 out and then move it downwards to form the stitch. These wire bonds 120 can provide a fixed potential (usually ground) to the semiconductor die 102. As shown by the length dimension 135 in FIGS. 1A and 1B, bond wires 120 can be long, especially when the bond pad 116 is not located near the edge of the semiconductor die 102. During the packaging process, these wires 120 become embedded in mold compound 122 (see FIG. 1A). Liquid mold compound is injected hot into a mold containing the semiconductor die 102 and the bond wires 120. As the thermoset mold compound 122 cools, it shrinks, pulling on the bond wires 120 and applying transverse stress to the interface between the mold compound 122 and the die pad 106. The longer the bond wires 120 are, the more the stress. This pulling stress can cause the mold compound 122 to delaminate from the die pad 106 and can also cause the mechanical stitch bond between a wire bond 120 and the die pad 106 to fail.

Figure 1E:
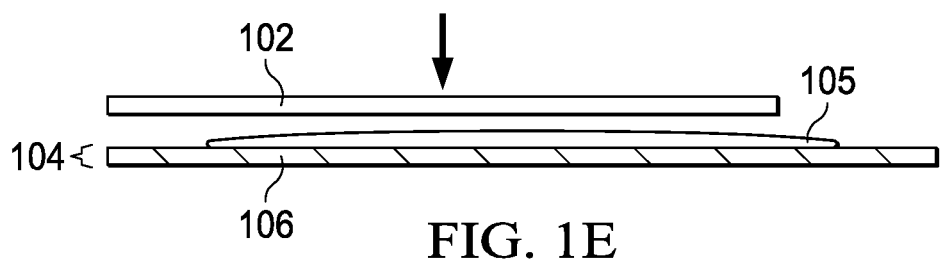
FIGS. 1E-1F are cross sectional views illustrating a resin bleed out example during mounting of a die to a die pad of a lead frame.
Figure 1F:
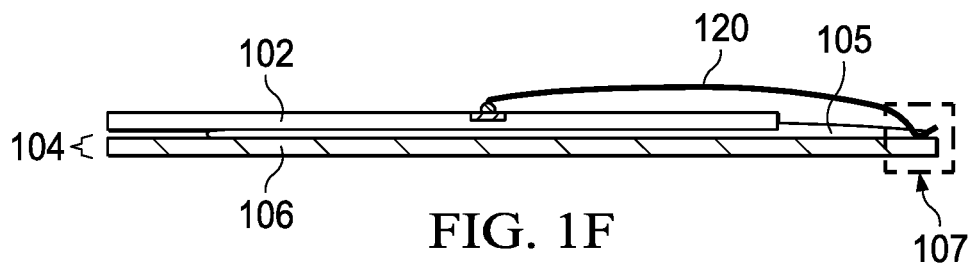

FIGS. 1E-1F illustrate a die attach resin bleed out situation that can occur during die mounting and die pad wire bonding. In FIG. 1E, lead frame 104 is shown in cross section with die pad 106. Die attach epoxy or paste material 105 is shown after it has been dispensed onto the die pad 106. A pick and place tool or other die handling equipment (not shown for clarity of illustration) moves a singulated semiconductor die 102 in position and presses it down into the die attach epoxy 105 and onto the die pad 106. The die attach epoxy spreads and flows due to capillary action. After the die is mounted, a cure step will cure the die attach epoxy 105.

As shown in FIGS. 1E-1F, after a cure the die attach epoxy 105 extends beyond the perimeter of die 102 and in this example has flowed to the edge of die pad 106. A bond wire 120 is extended to couple a bond pad on semiconductor die 102 to a bond location on die pad 106, this is done to couple a potential that can be placed on the die pad, for example ground or Vss, to the die 102. In the dotted area marked 107, the resin bleed out problem with wire bonding is clearly shown, the bond between bond wire 120 and the die pad 106 is interfered with by the presence of the die attach epoxy 105. Without the "bleed out" the die attach epoxy 105 should not extend to this bond location. The resin bleed out can cause a "non-stick on lead" failure where the stitch bond in the bond wire 120 does not stick to the die pad surface. In an automated wire bonding tool, an "assist" cycle may occur where the automated bonding is stopped when the stitch bond fails, and the bonding tool waits for an operator to come assist the tool, thus reducing throughput and potentially causing scrapped devices. In addition, mold compound adhesion is not as strong to the die attach epoxy material as to the lead frame surface, so that the resin bleed out can also contribute to delamination in the finished package.

Figure 2A:
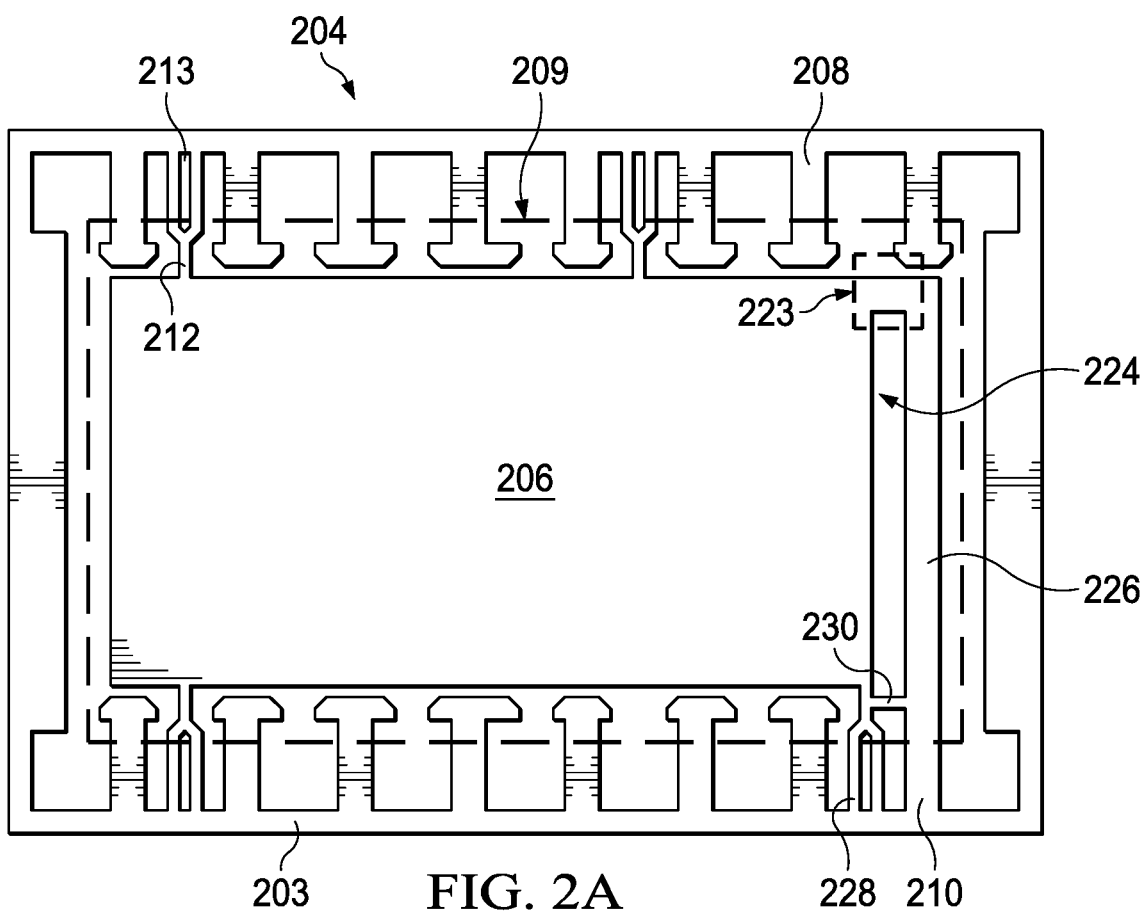
FIGS. 2A-2C are plan views and a projection view, respectively, of a lead frame with a split die pad and a projection view of a packaged semiconductor die with a semiconductor die mounted on a first die mount portion of the split die pad and with wire bonds to a second wire bonding portion of the split die pad.
Figure 2B:
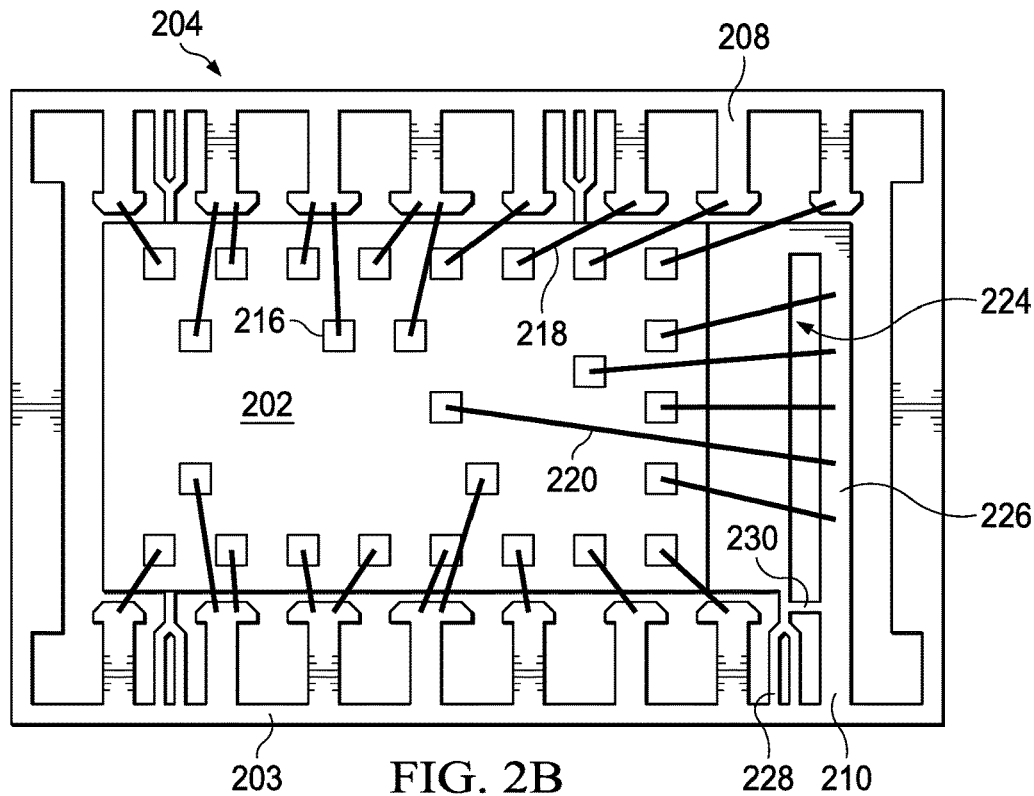
Figure 2C:
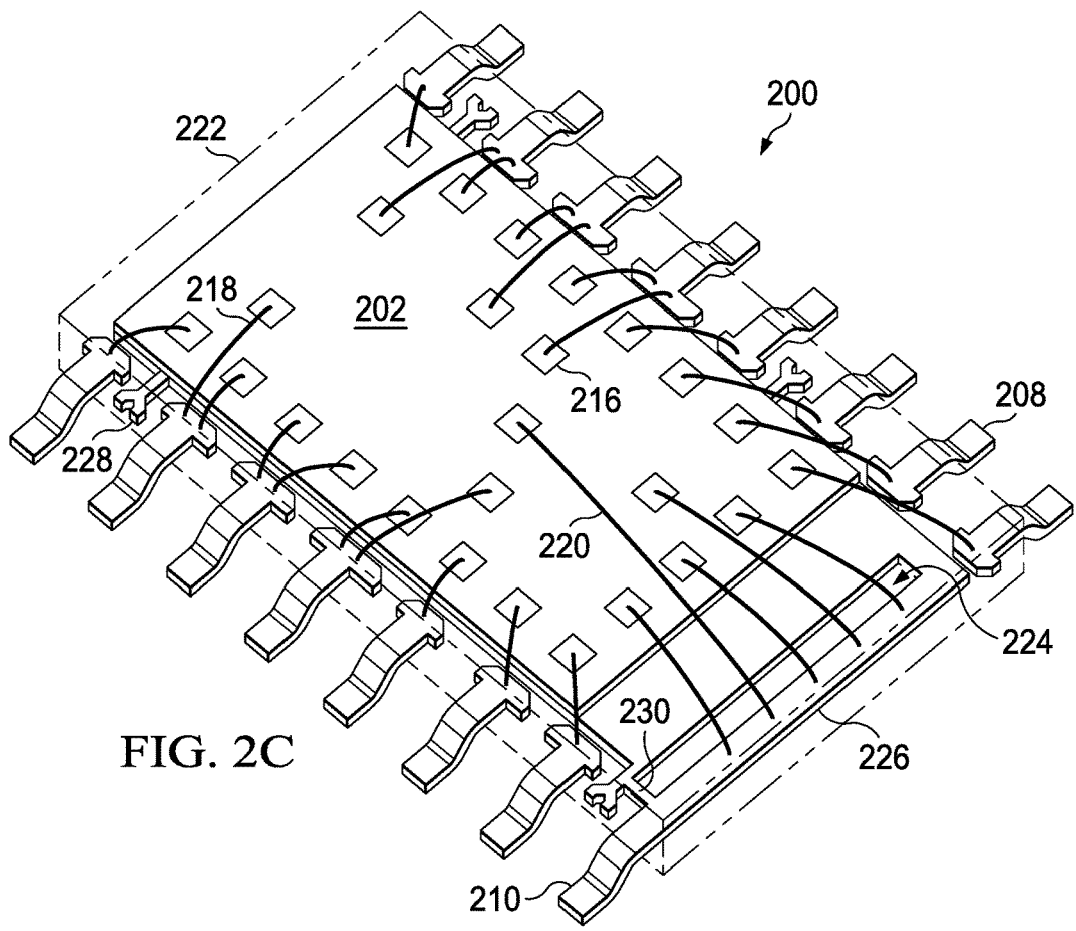

FIG. 2A shows a top down view of an arrangement lead frame 204 with a split die pad (209, shown in the dashed oval). In FIGS. 2A-2C similar reference labels are used for similar elements as are shown in FIGS. 1A-1D for clarity. For example, lead frame 204 in FIGS. 2A-2C corresponds to lead frame 104 in FIGS. 1A-1C.

The split die pad 209 has a slot 224 between a first portion that is die mount portion 206 and a second wire bonding portion 226. The second wire bonding portion 226 is connected to the die mount portion 206 by a "neck" portion shown in area 223 in FIG. 2A. From a plan view, the die mount portion 206 looks like the "head" of a tadpole, while the wire bonding portion 226 looks the "tail" of a tadpole, for this reason the split die pad 209 is sometimes referred to herein as a "tadpole" pad. A lead portion 210 extends from the external frame 203 to the wire bonding portion 226 and will provide an external lead for applying a potential, such as ground or Vss voltage, to the split die pad 209. The neck portion shown in area 223 in FIG. 2A provides an electrical connection and a mechanical connection to the die mount portion 206, so that the wire bonding portion 226 and the die mount portion 206 are at the same potential. Typically a ground or fixed voltage potential is applied to the die pad 209.

FIG. 2B shows in another plan view the lead frame 204 with a semiconductor die 202 mounted on die mount portion 206, and bond wires 220 extending from bond pads on the semiconductor die 202 to the wire bonding portion 226. A wire bond 220 with the first end bonded to a bond pad 216 on the semiconductor die 202 and the second end stitch bonded to the tadpole tail (wire bonding portion 226) which may be, for example, a ground bond, provides a fixed potential to the semiconductor die 202. As shown in FIG. 2C, mold compound 222 fills slot 224 during molding and blocks mold compound 222 shrinkage stress from reaching the ground bonds (bond wires 220 bonded to the wire bonding portion 226). The filled slot 224 (a mold lock) also prevents delamination of the mold compound 222 from the die mount portion 206. Also, during a die mounting operation, slot 224 will prevent resin bleed out problems, because the slot 224 prevents die attach epoxy resin bleed out from reaching the wire bonding portion 226. In this way the tadpole pad solves non-stick on lead problems due to resin bleed out, delamination problems, and bond wire pull off problems due to mold compound stress on wire bonds.

The slot width can range from about 0.100 mm to about 0.300 mm. The slot size can vary with lead frame thickness. The slot needs to be wide enough to ensure mold compound 222 can flow through the slot 224 during the packaging process. In example lead frame materials that were used in arrangements, slot sizes of 0.127 mm for a 5 mil thick lead frame, 0.150 mm for a 6 mil thick lead frame, 0.203 mm for a 8 mil thick lead frame, and 0.254 mm for a 10 mil thick lead frame were used, where a "mil" is 1/1000th of an inch. Since mold compound can include filler particles and these particles also need to flow through the slot, the minimum slot size needed for a particular lead frame and mold compound combination can easily be determined by experiment.

In FIG. 2A, a first end of the tadpole "tail" (wire bonding portion 226) is attached to the die mount portion 206 (the tadpole "head") by a neck portion at one end of the slot 224 (see area 223 in FIG. 2A). The second end of the tadpole tail (wire bonding portion 226) is connected to a package substrate lead 210 (typically, a ground or Vss lead) of the package. During molding, a portion of the lead 210 remains uncovered by mold compound 222 to enable it to be mounted and coupled to a land on a circuit substrate such as a printed circuit board (not shown). A damping tab 228 provides structural stability to the wire bonding portion 226 and die mount portion 206 during the wire bonding and packaging processes. The damping tab 228 reduces vibrations that could weaken the ground bonds during thermosonic wire bonding. A first side of the damping tab 228 is attached to the die mount portion 206, the "head" of the tadpole pad. A second side of damping tab 228 is attached to the external frame 203 that surrounds the lead frame 204. A third side of the damping tab 228 is adjacent to and electrically isolated from a lead frame signal lead 208. The fourth side of the damping tab 228 is adjacent to and is attached to the substrate lead 210 (usually a fixed potential lead) with a shorting bar 230. This shorting bar 230 remains intact when the external frame 203 of the lead frame is removed during a finished device singulation process. The shorting bar 230 provides a second electrical connection between the tadpole tail (wire bonding portion 226) and the die mount portion 206.

In FIG. 2B one end of a first wire bond 220 is bonded to a first bond pad 216 on the semiconductor die 202 and the other end of the first wire bond 220 is bonded to the tadpole tail (wire bonding portion 226) forming a fixed potential bond (for example a ground bond). One end of a second wire bond 218 is bonded to a second bond pad 216 on the semiconductor die 202 and the other end of the second wire bond 218 is bonded to a package substrate signal lead 208 (a signal bond). The potential on the signal lead can change during the operation of the semiconductor die 202 (between ground, 0 volts or $V_{SS}$, and the power supply, such as a voltage $V_{DD}$ in digital circuits, various other voltage levels can be signal voltages in power or analog circuits).

In FIG. 2C a molded leaded DIP package is shown in a projection view after completion. Lead frame portion 203 has been removed after molding. A slot 224 between the tadpole tail (wire bonding portion 226) and the tadpole head (die mount portion 206) fills with mold compound 222 during the packaging process, preventing lateral stress (especially on longer bond wires 220) from reaching the ground bonds. This reduces incidents of delamination between mold compound 222 and the split die pad (209 in FIG. 2A) and eliminates stress failure of the ground bonds. The damping tab 228 provides additional support to the tadpole tail (wire bonding portion 226) during wire bonding and packaging. The shorting bar 230 provides additional mechanical support to the tadpole tail (wire bonding portion 226) and to the die mount portion 206. Note the ends of the damping tab 228 are shown in FIG. 2C after being cut from the frame 203 during a trim and form step. Lead 210 has been shaped (along with the other leads) to form a package lead for the completed package device 200.

FIGS. 3A-3G illustrate in a series of views major steps in forming a packaged semiconductor die 300 with the split die pad with a tadpole shaped head (die mount portion 306) and a tadpole shaped tail (wire bonding portion 326) separated by a slot 324.

In FIGS. 3A-3G similar reference labels are used for similar elements as are shown in FIGS. 2A-2C, for clarity. For example, lead frame 304 in FIGS. 3A-3G corresponds to lead frame 204 in FIGS. 2A-2C. Descriptions of the major steps in FIGS. 3A-3G are listed in the process flow diagram in FIG. 4.

Figure 3A:
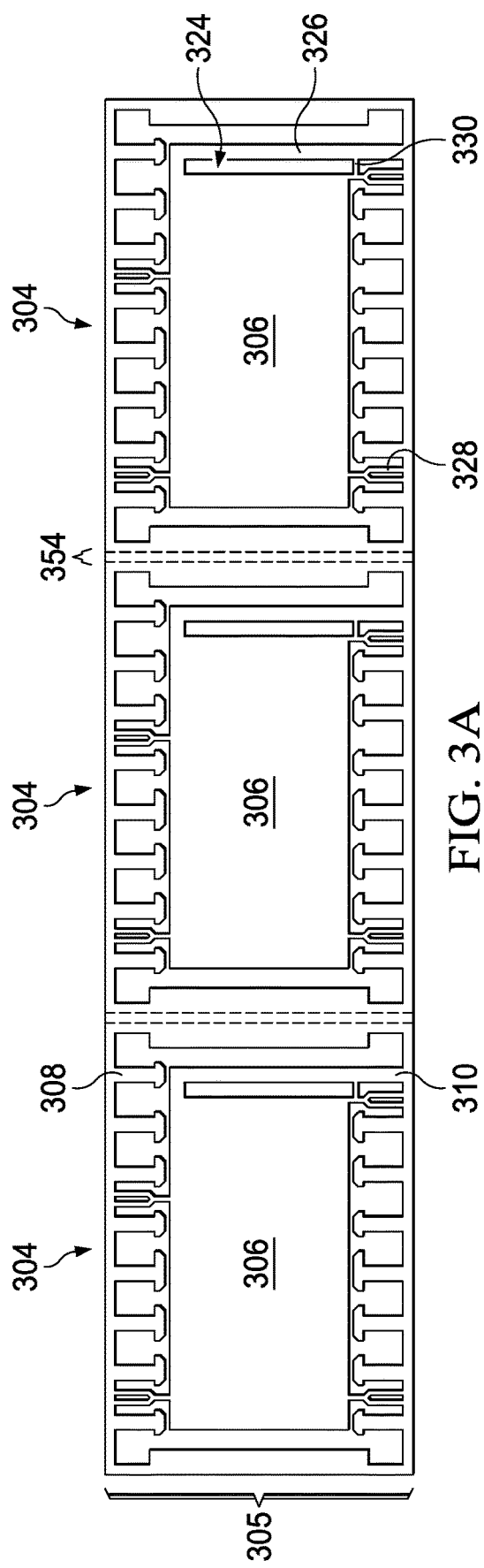

FIG. 3A shows a lead frame strip 305 with three lead frames 304 connected together with saw streets 354 made of lead frame material. (Step 401, FIG. 4). The lead frames 304 have split die pads with die mount portions 306, signal leads 308, lead 310, wire bonding portions 326, slots 324, damping tabs 328 and a shorting bar 330. An external frame 303 surrounds the lead frames 304 providing structural stability during the wire bonding and packaging processes. (The external frame 303 is removed in a trim and form tool during the packaged device singulation process.)

Figure 3D:
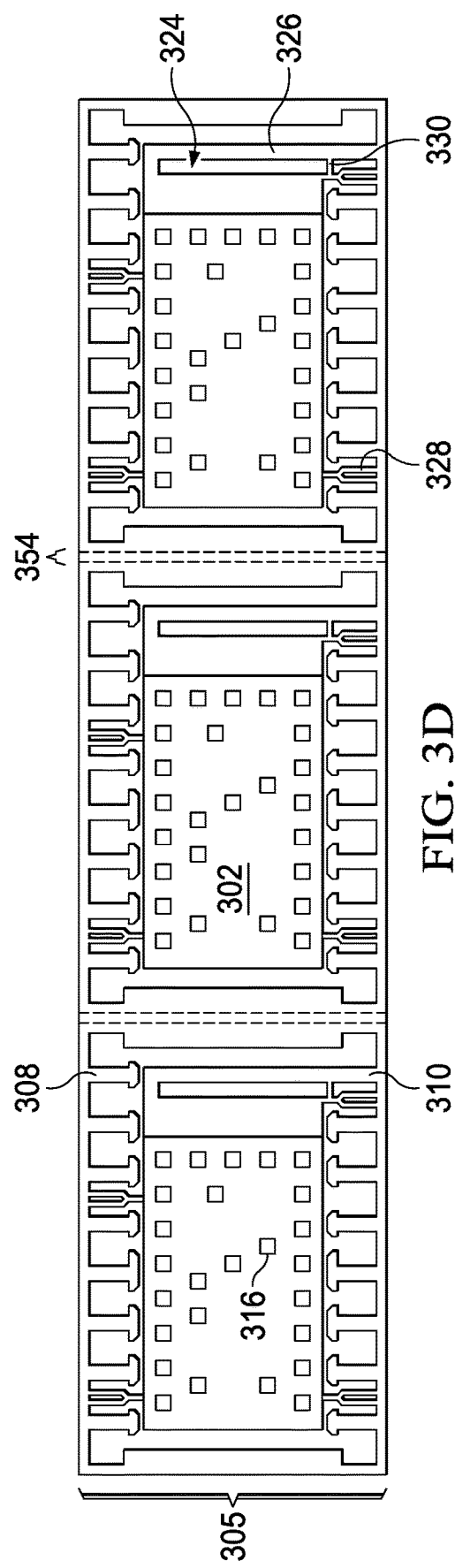
Figures 3B, 3C:
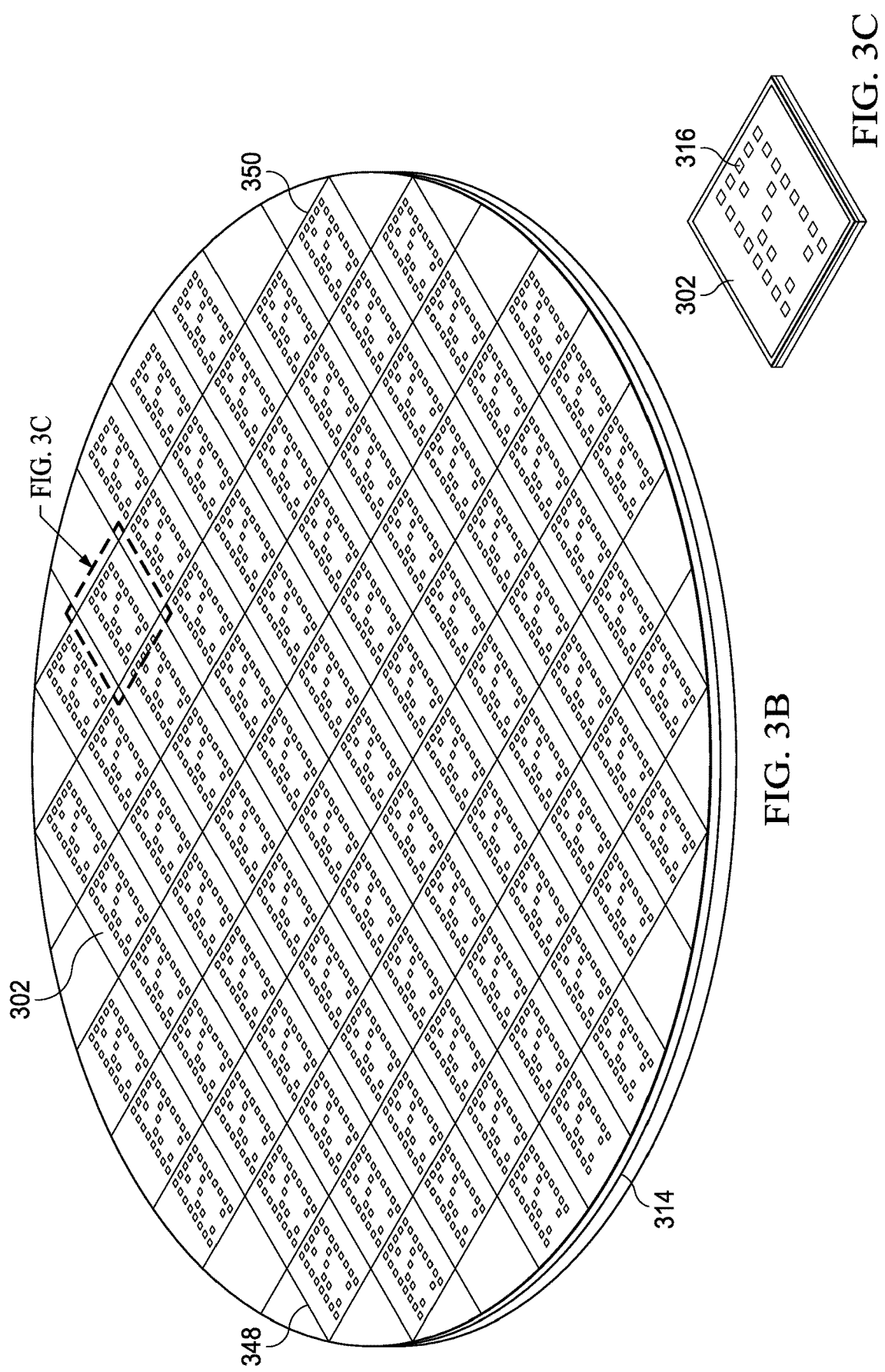

FIG. 3B shows a semiconductor substrate, such as a semiconductor wafer 314, whose surface is covered with semiconductor device dies 302. Horizontal scribe lanes 348 (horizontal as the wafer is portrayed in FIG. 3B) and vertical scribe lanes 350 separate each die 302 from adjacent dies 302.

Figure 4:
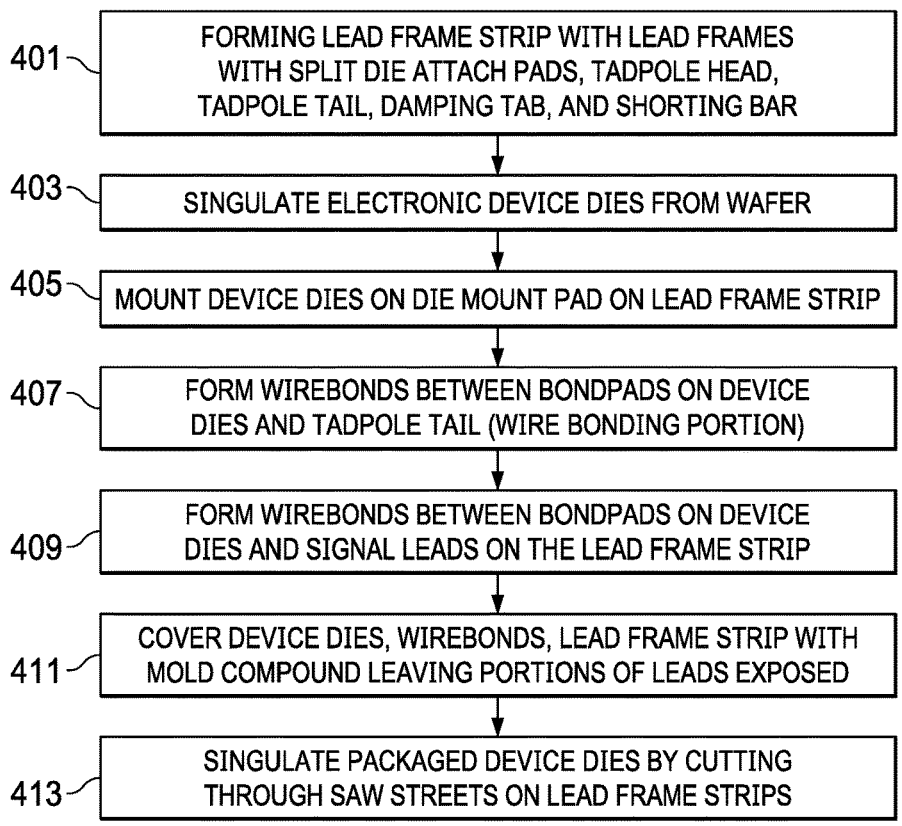
FIG. 4 is a flow diagram illustrating a method corresponding to the manufacturing steps in FIGS. 3A-3G.

The semiconductor device dies 302 are singulated by cutting through the wafer 314 along the horizontal 348 and vertical 350 scribe lanes (horizontal and vertical as the wafer is oriented in FIG. 3B) (see step 403, FIG. 4). FIG. 3C is an expanded view of one of the singulated dies 302 with bond pads 316 on the device side of the semiconductor die 302.

In FIG. 3D, singulated dies 302 are mounted on die mount portions 306 (step 403) of the split die pads on a package substrate 304. In this example arrangement, the package substrate 304 is a lead frame in a lead frame strip 305. The package substrate 304 can also be tape-based and film-based substrates carrying conductors; ceramic substrates, laminate substrates with multiple layers of conductors and insulator layers; and printed circuit board substrates of ceramic, fiberglass or resin, or glass reinforced epoxy substrates such as FR4. The package substrates can be PMLF and MIS substrates. The lead frame strip 305 is comprised of several individual lead frames 304 (die mount portion 306, wire bonding portion 326, signal leads 308, leads 310). The individual lead frames 304 are joined together by saw streets 354 that are made of the lead frame material. Each lead frame has a split die pad with a die mount portion and a wire bonding portions spaced by a slot as described hereinabove with respect to FIGS. 2A-2C.

In FIG. 3E, first bond pads 316 on the semiconductor dies 302 are electrically coupled to the tadpole tail (wire bonding portion 326) on the lead frame 304 using wire bonds 320 (step 407). In an example arrangement, this provides a way to couple a fixed potential (such as ground or Vss) to the semiconductor dies 302. Additional bond pads 316 on the semiconductor dies 302 are coupled to the lead frame signal leads 308 with wire bonds 318 (step 409). Other conductive connectors such as ribbon bonds can be used as an alternative to the wire bonds.

In FIG. 3F, the dies 302, the wire bonds 318 and 320, and portions of the signal leads 308 and ground leads 310 are covered with mold compound 322 such as a filled epoxy (step 411). The mold compound can be a thermoset epoxy resin. In an example where a high voltage semiconductor device is mounted, the mold compound meets the CTI (comparative tracking index) level 1, CTI>600 V, of the IEC 61010-1 standard. Mold compound exposed to high voltages can exhibit a conductive leakage path on the surface that forms as a carbonized track. The materials used for electrical mold compound (EMC) are rated in terms of isolation using the CTI index. Isolation requirements must be considered when choosing the mold compound for a particular application.

Figure 3G:
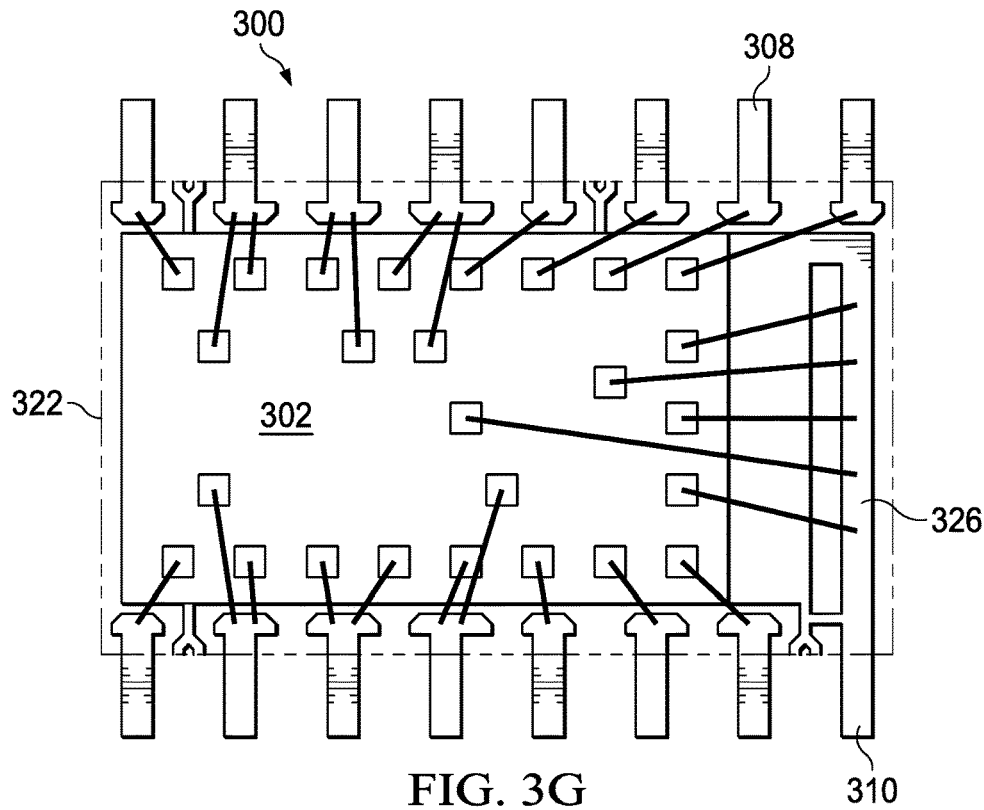

In FIG. 3G, individual packaged semiconductor dies 300 are singulated (step 413) from one another by cutting through the saw streets 354 between the lead frames 304 and by cutting away the external frames 303 in the lead frame strip 305.

FIG. 3G shows a top down view of a singulated packaged semiconductor device 300 with the split die pad including the tadpole head (die mount portion 306) separated from the tadpole tail (wire bonding portion 326) by a slot 324. In FIG. 2C, described hereinabove, the figure shows a projection view of the small outline integrated circuit (SOIC) packaged semiconductor device 200 corresponding to the plan view shown in FIG. 3G.

The slot 324 between the tadpole tail (wire bonding portion 326) and the tadpole head (die mount portion 306) provides an opening through which mold compound 322 flows during molding. This opening also prevents resin bleed out from die attach epoxy on die mount portion 306 from reaching the wire bonding portion 326, and thus prevents non-stick on lead problems with the ground bonds. Slot 324 also forms a mold lock between mold compound 322 on the two opposing surfaces of the die mount pad 306. This mold lock prevents stress that accumulates along the bond wires 320 during mold compound shrinkage from reaching the ground bonds on the wire bonding portion 326. Use of the split die pad of the arrangements reduces delamination between the mold compound 322 and the die mount pad 306 and also reduces failure of ground bonds between the bond wires 320 and the wire bonding portion 326 of the split die pads.

FIGS. 5A-5E illustrate in a series of views the major steps in the manufacture of a multichip module (MCM) with more than one split die pad with die mount portions 506, 507 and corresponding wire bonding portions 526, 527 spaced by slots 524, 525 and with more than one semiconductor die (552, 555, 556, 558, element 560) mounted to the die mount portions. In FIGS. 5A-5E similar reference labels are used for similar elements as are shown in FIGS. 2A-2C for clarity. For example, wire bonding portion 526 in FIGS. 5A-5C corresponds to wire bonding portion 226 in FIGS. 2A-2C.

Figure 5A:
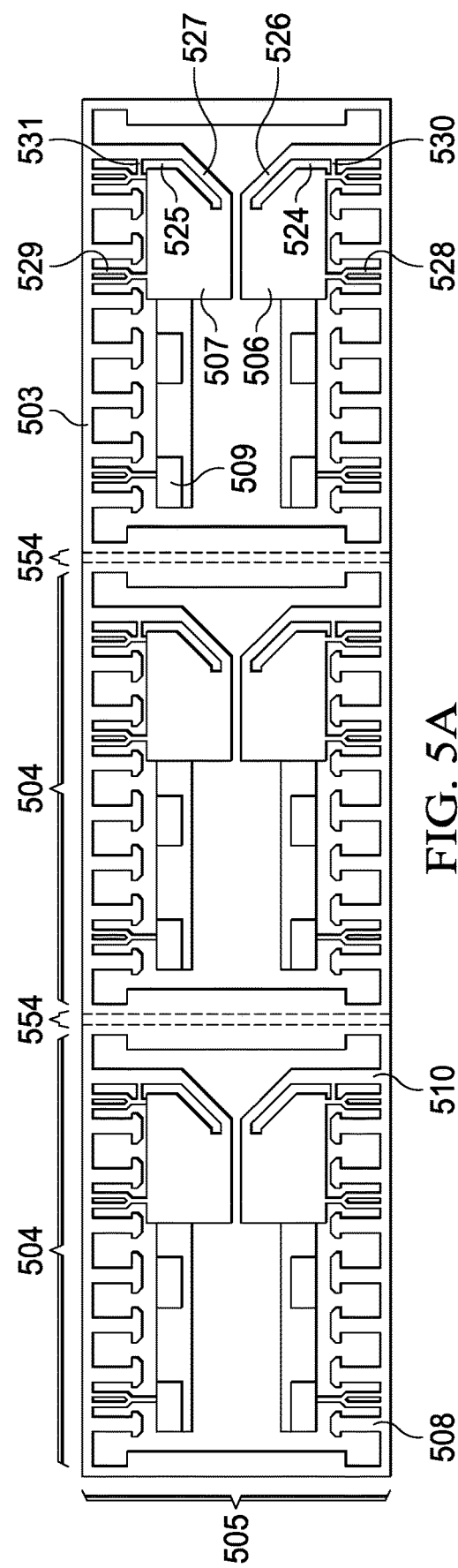
FIGS. 5A-5E are plan views and a projection view of the main manufacturing steps in the manufacture of a packaged multichip module with semiconductor dies mounted on first die mount portions of split die pads and with wire bonds to second wire bonding portions of the split die pads.

The lead frame strip 505 in FIG. 5A has three lead frames 504 coupled together with saw streets 554 made of lead frame material. Each lead frame 504 has three die mount portions 506, 507 and 509 and two wire bonding portions 526 and 527. Damper tabs 528, 529 couple wire bonding portions 526, 527 and die mount portions 506, 507 to the external frame 503 surrounding the lead frames 504. In addition mount portions 509 are arranged to mount a passive element, in this example a laminate (see element 560 in FIG. 5B) that carries inductors, coils or transducers is mounted in the multichip module.

Figure 5B:
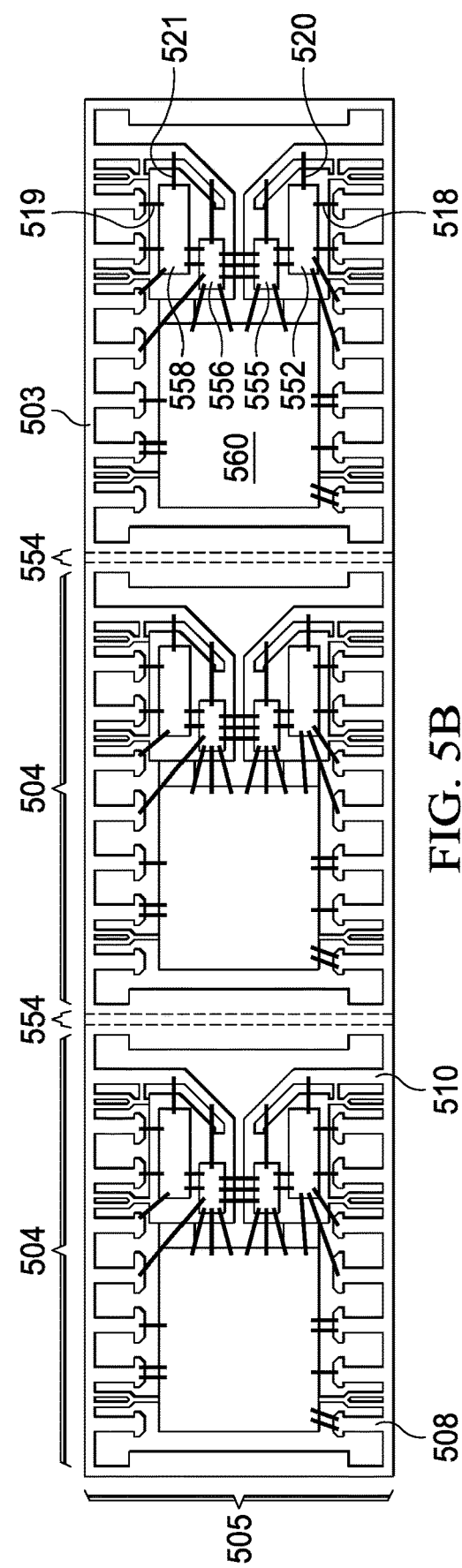

In FIG. 5B semiconductor dies 552 and 555 are mounted on die mount portion 506 and semiconductor dies 556 and 558 are mounted on die mount portion 507. Element 560 is mounted on die mount portion 509. In mounting dies, in some arrangements, an anti-resin bleed out material may be applied to the package substrate. However, as in this illustrated example, if more than one die is mounted to a single die pad using a die attach material, a die attach cure step following the first die mount can reduce the effectiveness of the anti-resin bleed out material for the second die mount, so that the die attach epoxy paste may bleed out when the second die is mounted. The cure after the first die mount reduces the effectiveness of the anti-resin bleed out material. Use of the slots of the split die pads in the arrangements ensures that wire bonds made to the wire bonding portions of the split die pads are not impacted by resin bleed out on the die mount portions, whether or not an anti-resin bleed out material is applied. Wire bonds 520 couple bond pads on die 552 to a first tadpole tail (wire bonding portion 526). Wire bonds 521 couple bond pads on die 558 to a second tadpole tail (wire bonding portion 527). In this example the split die pad, with the tadpole shape, has an irregular polygon shape with five sides. Other shapes can be used. Rectangular, square, rhomboid, rhombus, circular, oval, triangular and other pad shapes can be used with a die mount portion spaced from a wire bonding portion by a slot, so that a part of the wire bonding portion is attached to the die mount portion at one end of the slot. In this example, the slots 524, 525 are parallel to the overall shape of the split die pad and have a central bent portion to match the intersection of the two short sides of the irregular polygon shape of the die mount portions. In all of these different shapes, the slots space the wire bonding portion from the die mount portion of the split die pads, and the slots also form mold locks.

Figure 5C:
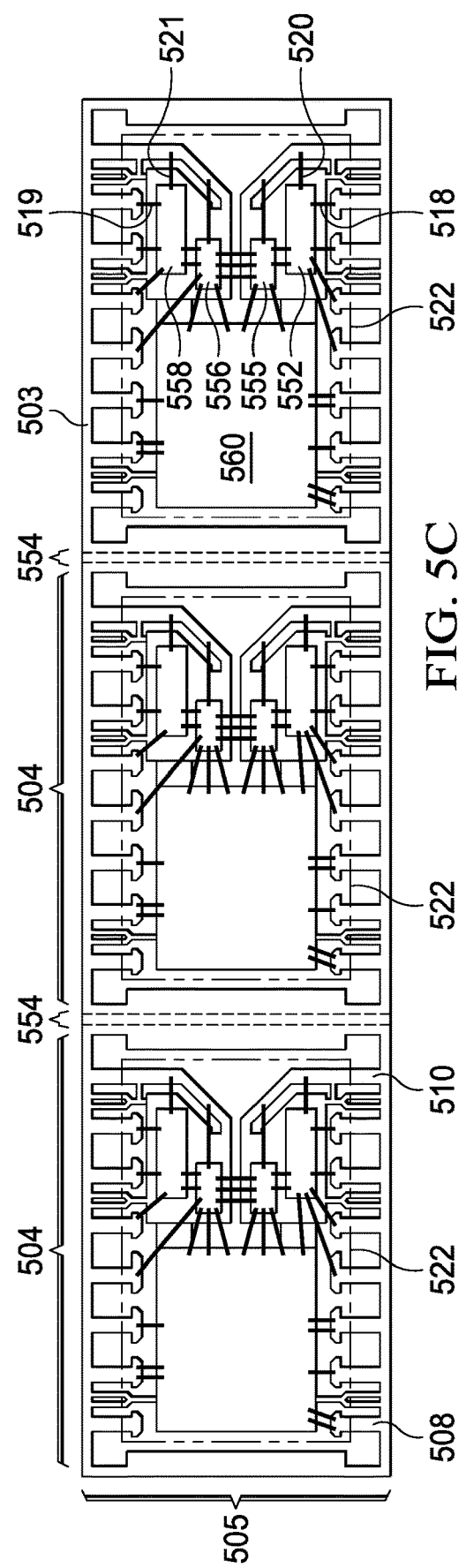

In FIG. 5C, on each lead frame 504 the semiconductor dies 552, 555, 556, 558, 560; the die mount portions 506, 507; the wire bonding portions 526, 527, the wire bonds 518, 519, 520, 521; the damping tabs 528, 529; and a portion of the signal leads 508 and of ground leads 510 are covered with mold compound 522. A portion of the signal leads 508 and potential leads 510 remain exposed from the mold compound 522 after molding, these portions are to be formed as external leads for the packaged devices. The external leads enable mounting the packaged MCM devices 500 on the conductive lands of a circuit substrate such as a printed circuit board. In this example arrangement, the element 560 is a coil on a laminate, the dies 555, 556 are coupling capacitors, and the dies 558, 552 are switching transistors, to form a pair of electrically isolated switching circuits in a single multichip module.

Figure 5D:
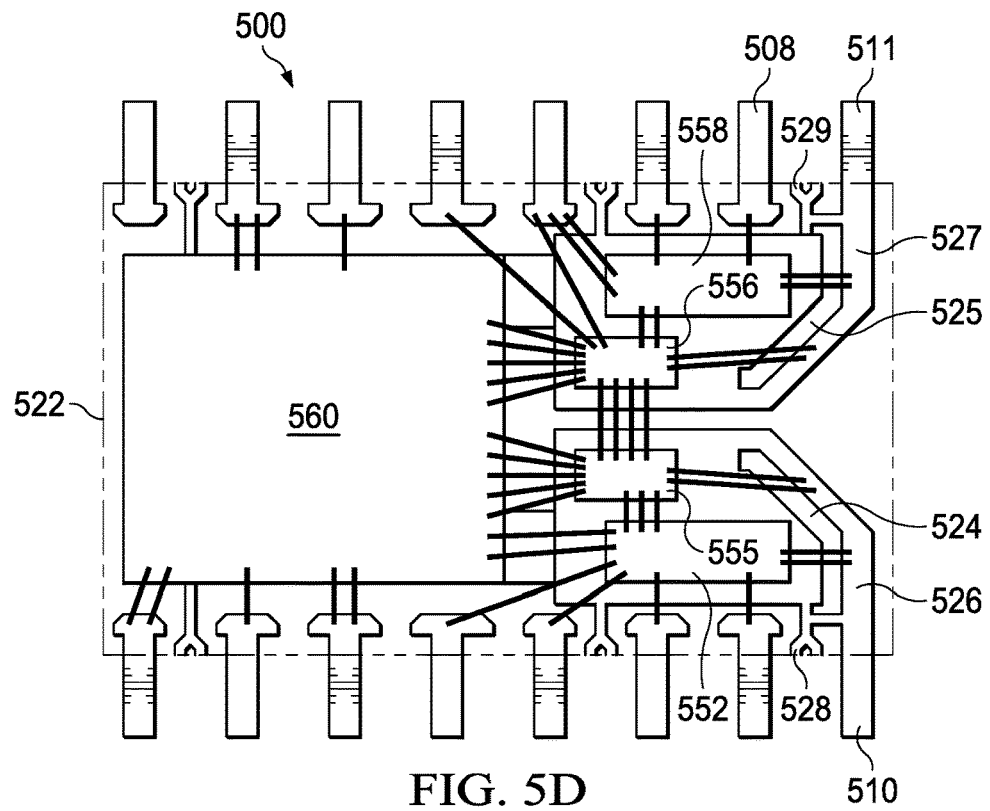

FIG. 5D is a top down view of one packaged MCM 500 after it has been singulated from the lead frame strip 505 by cutting through the saw streets 554 and by cutting through the signal leads 508 and leads 510 to remove the exterior frame 503. The support tabs 528, 529 are cut in a trim and form operation and are not used as an electrical connection, but the cut ends are visible at the exterior surface of the mold compound 522 in FIGS. 5D and 5E.

Figure 5E:
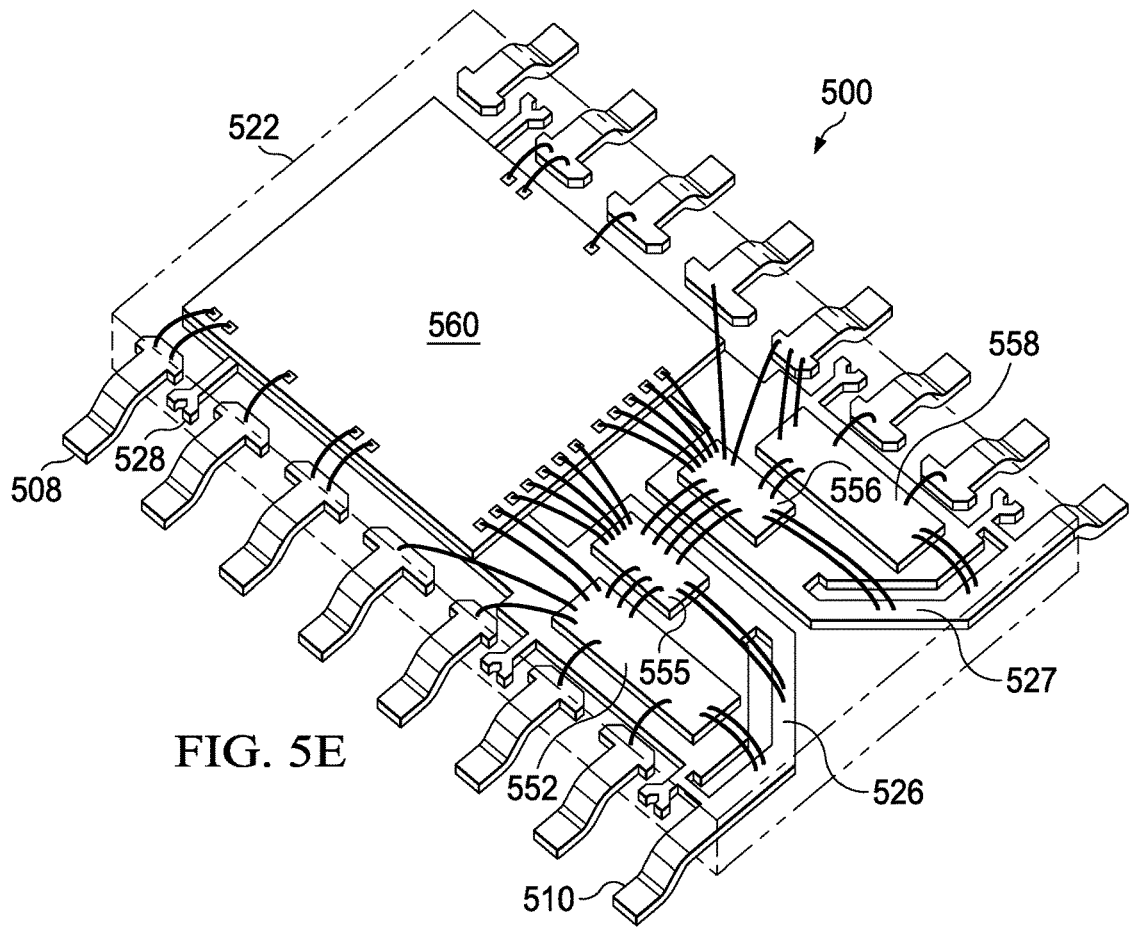

FIG. 5E is a projection view of the completed small outline integrated circuit (SOIC) packaged multichip module (MCM) 500. This MCM 500 has two split die pads with wire bonding portions 526, 527 and die mount pads 506, 507 with multiple semiconductor dies 552, 555, 556, 558 mounted on them. An element 560 is mounted on another die mount portion. Other package types, a few examples are illustrated in FIGS. 6A-6D, can be used with the arrangements.

The tadpole tail (wire bonding portions) 526, 527 are separated from the tadpole head (die mount portions) 506, 507 by slots 524, 525. The first ends of the wire bonding portions 526, 527 are coupled to the die mount portions 506, 507 of the split die pads by a neck portion of lead frame material at one end of the slots 524, 525. Second ends of the tadpole tails (wire bonding portions 526, 527) are coupled to the leads 510 and 511 which can supply a fixed potential to the dies. The damping tabs 528, 529 coupled between the die mount pads 506, 507 and the external frame 503 provide stability during the wire bonding and packaging processes. Shorting bars 530, 531 (see FIG. 5A) between the damping tabs 528, 529 (FIG. 5A) and the wire bonding portions 526, 527 provide a mechanical support and connection between the tadpole tails (wire bonding portions 526, 527) and the tadpole head (die mount portions 506, 507). The slots 524, 525 function as mold locks which block stress due to mold compound 522 shrinkage along the length of the wire bonds 520,521 from reaching the ground bonds on the bond wiring portions 526, 527. As described above, the slots 524, 525 prevent non-stick on lead problems due to resin bleed out after the die mounting of the semiconductor dies on the die mount portions 506, 507. The split die pad design reduces delamination between the mold compound 522 and the die mount portions 506, 507 and reduces failure of the die pad wire bonds due to mold compound shrinkage stress.

Figure 6A:
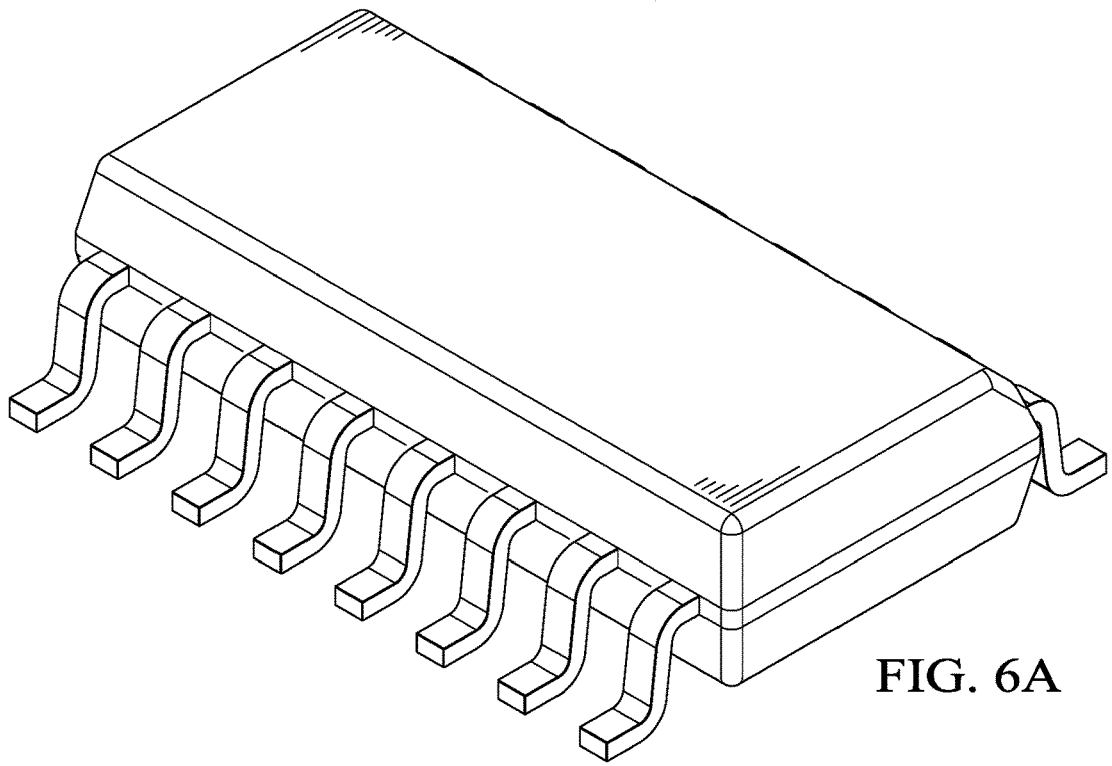
FIGS. 6A-6D are projection views of example semiconductor device packages that can be used with the split die pads.
Figure 6B:
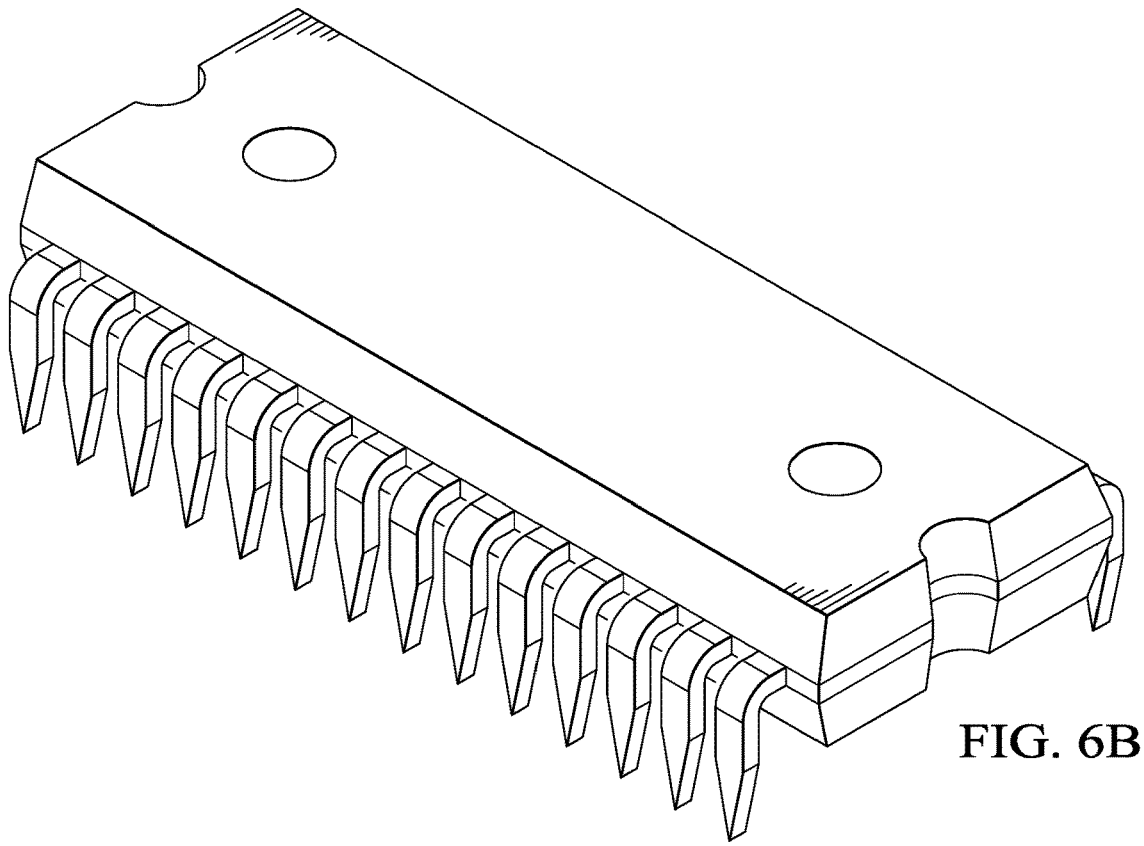
Figure 6C:
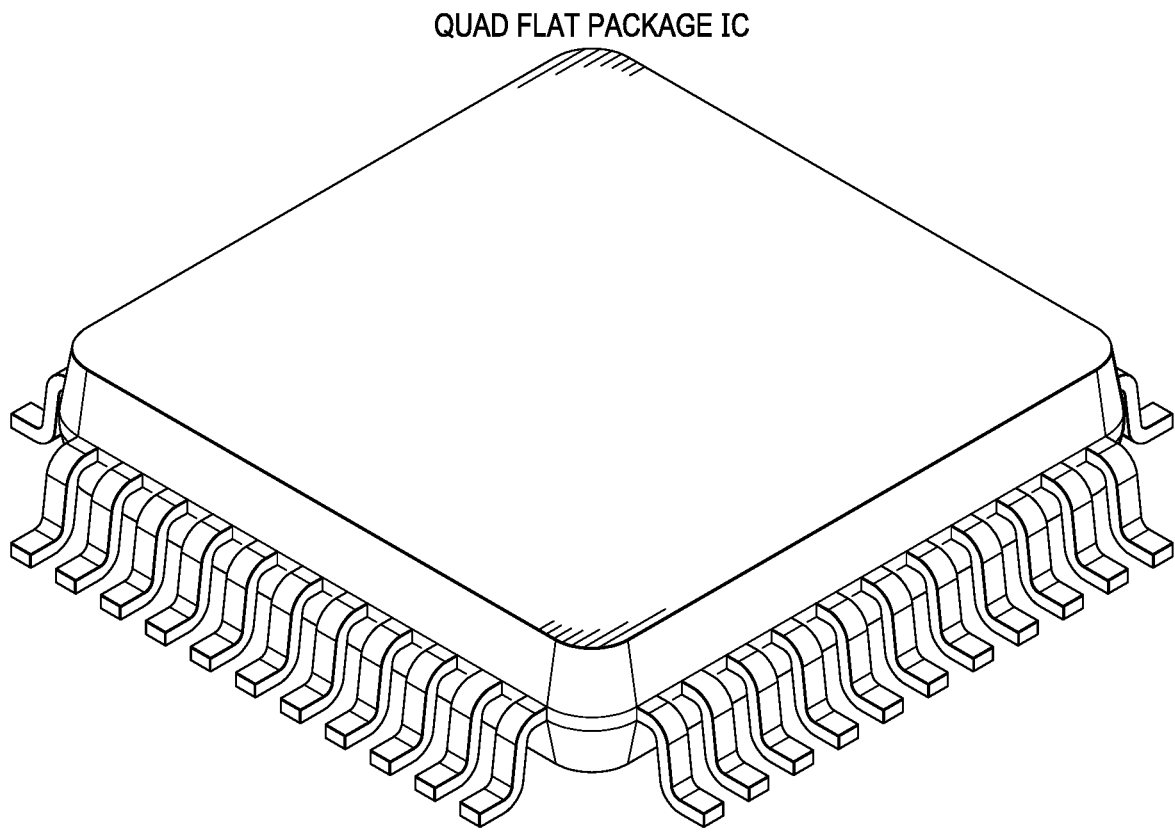
Figure 6D:
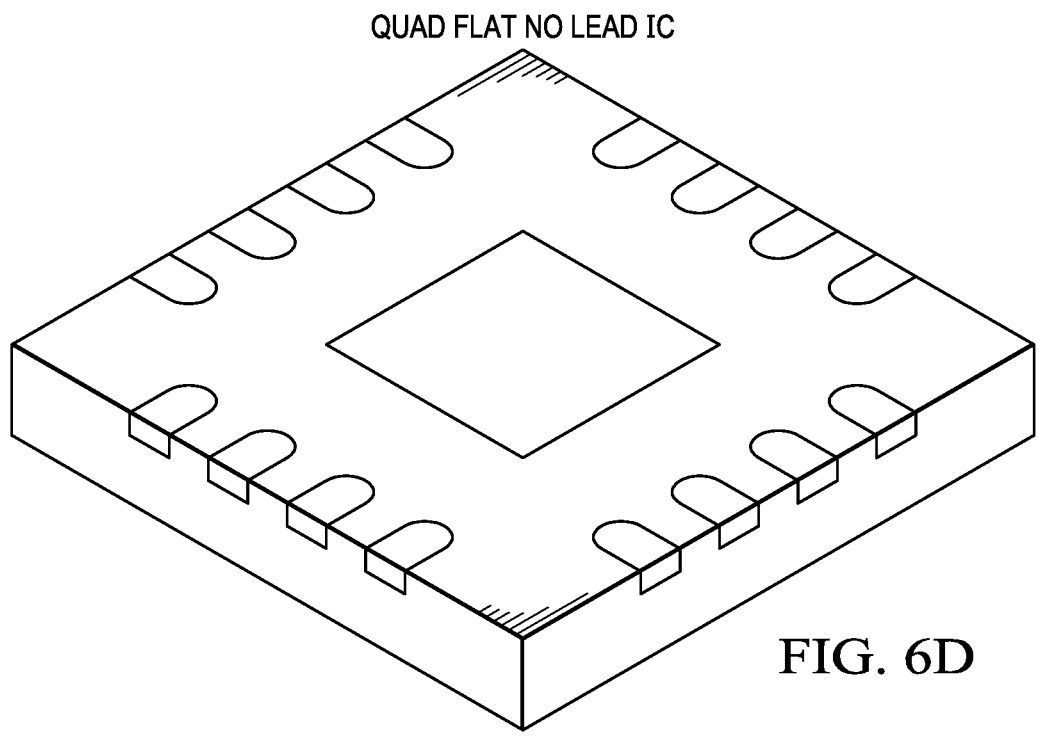

FIGS. 6A-6D show in projection views a few representative examples of semiconductor die packages that can be used with the arrangements. These semiconductor packages can contain single semiconductor die or can contain multiple semiconductor dies. All accommodate the split die pad design of the arrangements. FIG. 6A is a small outline integrated circuit (SOIC). FIG. 6B is a dual inline package integrated circuit (DIP). FIG. 6C is a leaded quad. flat package integrated circuit (QFP). FIG. 6D is a quad. flat no lead package integrated circuit (QFN).

Modifications are possible in the described arrangements, and other alternative arrangements are possible within the scope of the claims.

What is claimed is:

1. An apparatus, comprising:
   a package substrate with a split die pad having a slot between a die mount portion and a wire bonding portion with smaller area than the die mount portion;
   a first end of the wire bonding portion directly attached and physically connected to the die mount portion at one end of the slot;
   a second end of the wire bonding portion coupled to a first lead on the package substrate;
   at least one semiconductor die mounted on the die mount portion;
   a first end of a first wire bond bonded to a first bond pad on the at least one semiconductor die;
   a second end of the first wire bond bonded to the wire bonding portion;
   a first end of a second wire bond bonded to a second bond pad on the at least one semiconductor die;
   a second end of the second wire bond bonded to a signal lead on the package substrate;
   mold compound covering the at least one semiconductor die, the die mount portion, the wire bonding portion, and filling the slot; and
   the mold compound covering at least a portion of the signal lead and at least a portion of the first lead.

2. The apparatus of claim 1, the package substrate further comprising a damping tab coupled between the die mount portion and the wire bonding portion.

3. The apparatus of claim 2, wherein a shorting bar couples the damping tab to the wire bonding portion.

4. The apparatus of claim 1, wherein the package substrate is a lead frame.

5. The apparatus of claim 1, wherein a width of the slot is at least 0.100 millimeters.

6. The apparatus of claim 1, further comprising at least a second semiconductor die mounted on the die mount portion.

7. The apparatus of claim 1, wherein the split die pad comprises a first split die pad and further comprising a second split die pad having a second die mount portion and a second wire bonding portion spaced from the second die mount portion by a second slot, and at least a second semiconductor die mounted on the second die mount portion.

8. The apparatus of claim 1, wherein more than one semiconductor die is mounted on the die mount portion and the apparatus forms a semiconductor package that is a multichip module (MCM).

9. The apparatus of claim 1, wherein the apparatus forms a semiconductor package that is one selected from a group consisting essentially of: a small outline integrated circuit (SOIC) package, a dual inline package (DIP), a quad. flat package (QFP), and a quad. flat no lead (QFN) package.

10. A method, comprising:
    mounting at least one semiconductor die on a package substrate having at least one split die pad that comprises a slot separating a die mount portion from a wire bonding portion, the wire bonding portion directly attached and physically connected to the die mount portion at a first end of the slot;
    coupling a first lead of the package substrate to the wire bonding portion at a second end of the slot opposite the first end of the slot;
    forming a first wire bond between a first bond pad on the at least one semiconductor die and the wire bonding portion;
    forming a second wire bond between a second bond pad on the at least one semiconductor die and a signal lead on the package substrate;
    covering the at least one semiconductor die, the wire bonding portion, the die mount portion, the first and second wire bonds, and at least a portion of the signal lead and at least a portion of the first lead with mold compound, leaving a portion of the signal lead and the first lead not covered with mold compound; and
    removing an external frame from the package substrate to form a packaged semiconductor device.

11. The method of claim 10, further comprising:
    forming at least one damping tab on the package substrate with a first side attached to the die mount portion, a second side attached to the external frame on the package substrate, with a third side adjacent to and electrically isolated from a signal lead, and with a fourth side adjacent to the first lead;
    connecting the damping tab to the first lead with a shorting bar; and
    removing the external frame from the damping tab after covering the semiconductor die with mold compound.

12. The method of claim 10, wherein the slot is at least 0.100 mm wide.

13. The method of claim 10, wherein:
    the package substrate further comprises a package substrate strip with multiple individual package substrates coupled together with saw streets made of package substrate material; and
    singulating individual package substrates after covering the semiconductor dies with mold compound by cutting through the saw streets.

14. The method of claim 10, wherein the package substrate is a lead frame.

15. The method of claim 10, wherein the package is one selected from a group consisting essentially of: a small outline integrated circuit (SOIC) package, a dual inline package (DIP), a quad. flat package (QFP), and a quad. flat no lead (QFN) package.

16. The method of claim 10, and further comprising: mounting at least a second semiconductor die on the die mount portion; and forming a packaged multi-chip module.

17. The method of claim 10, further comprising:
mounting at least one second semiconductor die on a second die mount portion spaced from a second wire bonding portion by a second slot in the package substrate, a first end of the second wire bonding portion attached to the second die mount portion at one end of the second slot;
attaching a second end of the second wire bonding portion to a second lead of the package substrate;
forming a third wire bond between a third bond pad on the at least one second semiconductor die and the second wire bonding portion;
the signal lead forming a first signal lead, and forming a fourth wire bond between a fourth bond pad on the at least one second semiconductor die and a second signal lead;
filling the second slot with mold compound and covering the at least one second semiconductor die, the second die mount portion, the second wire bonding portion, and the third and fourth wire bonds with the mold compound; and
leaving a portion of the second signal lead and the second lead not covered with mold compound.

18. The method of claim 17, wherein the package substrate comprises part of a package substrate strip with multiple multichip module package substrates coupled together by saw streets made of package substrate material;
singulating multichip module package substrates one from another by cutting through the saw streets after the mold compound covering step; and
forming individual multi-chip module packages.

19. A packaged electronic device, comprising:
a package substrate with at least one split die pad including a slot between a die mount portion and a wire bonding portion having smaller area than the die mount portion;
a first end of the wire bonding portion directly attached and physically connected to the die mount portion at one end of the slot;
a second end of the wire bonding portion coupled to a first lead on the package substrate;
at least one semiconductor die mounted on the die mount portion;
a first end of a first wire bond bonded to a first bond pad on the at least one semiconductor die;
a second end of the first wire bond bonded to the wire bonding portion;
a first end of a second wire bond bonded to a second bond pad on the at least one semiconductor die;
a second end of the second wire bond bonded to a signal lead on the package substrate;
mold compound covering the at least one semiconductor die, the die mount portion, the wire bonding portion, and filling the slot; and
the mold compound covering a portion of the signal lead and covering a portion of the first lead.

* * * * *